(12) United States Patent
Abdo

(10) Patent No.: US 10,062,829 B1
(45) Date of Patent: Aug. 28, 2018

(54) ISOLATOR BASED ON NONDEGENERATE THREE-WAVE MIXING JOSEPHSON DEVICES

(71) Applicant: INTERNATIONAL BUSINESS MACHINES CORPORATION, Armonk, NY (US)

(72) Inventor: Baleegh Abdo, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/587,539

(22) Filed: May 5, 2017

(51) Int. Cl.
*H01L 39/02* (2006.01)
*H01P 1/36* (2006.01)
*H01L 39/22* (2006.01)
*H01L 39/24* (2006.01)

(52) U.S. Cl.
CPC .......... *H01L 39/025* (2013.01); *H01L 39/223* (2013.01); *H01L 39/2493* (2013.01); *H01P 1/36* (2013.01)

(58) Field of Classification Search
CPC . H01L 39/025; H01L 39/223; H01L 39/2493; H01P 1/36
USPC ....................................................... 327/528
See application file for complete search history.

(56) References Cited

U.S. PATENT DOCUMENTS

| | | | |
|---|---|---|---|
| 8,130,054 B1 * | 3/2012 | Martin | H01P 1/36 333/1.1 |
| 9,589,236 B1 | 3/2017 | Abdo | |
| 2002/0179931 A1 | 12/2002 | Traylor | |
| 2015/0241481 A1 | 8/2015 | Narla et al. | |
| 2016/0292586 A1 | 10/2016 | Rigetti et al. | |
| 2016/0308502 A1 | 10/2016 | Abdo et al. | |
| 2017/0093381 A1 | 3/2017 | Abdo | |

OTHER PUBLICATIONS

Baleegh Abdo, "Isolator Based on Nondegenerate Three-Waving Mixing Josephson Devices", Related Application, U.S. Appl. No. 15/813,964, filed Nov. 15, 2017.
List of IBM Patents or Patent Applications Treated as Related; (Appendix P), Filed Nov. 15, 2017; pp. 1-2.
B. Abdo et al., "Directional amplification with a Josephson circuit," Physical Review X, vol. 3, No. 3, 2013, 031001. pp. 1-8.
B. Abdo et al., "Josephson directional amplifier for quantum measurement of superconducting circuits," Physical Review Letters, vol. 112, No. 16, 2014, 167701, pp. 1-5.
J. Mazur et al., "Isolator using a ferrite-coupled-lines gyrator," IEE Proceedings-Microwaves, Antennas and Propagation, vol. 149, No. 56, 2002, pp. 291-294.
J. Mazur et al., "Theoretical and experimental treatment of a microstrip coupled ferrite line circulator," IEE Proceedings—Microwaves, Antennas and Propagation, vol. 151, No. 6, 2004, pp. 477-480.

* cited by examiner

*Primary Examiner* — William Hernandez
(74) *Attorney, Agent, or Firm* — Cantor Colburn LLP; Vazken Alexanian

(57) ABSTRACT

A technique relates to a superconducting device. A gyrator includes a first mixing device coupled to a second mixing device. A lumped-element resistor is connected in parallel to the gyrator.

13 Claims, 14 Drawing Sheets

ISOLATOR 600

FIG. 11  SIGNAL

RECEIVE A SIGNAL AT A FIRST MIXING DEVICE COUPLED TO A SECOND MIXING DEVICE, THE FIRST AND SECOND MIXING DEVICES BEING COUPLED IN PARALLEL TO A LUMPED-ELEMENT RESISTOR 1402

OUTPUT THE SIGNAL FROM THE SECOND MIXING DEVICE, WHEREIN ANY SIGNAL RECEIVED AT THE SECOND MIXING DEVICE IS BLOCKED FROM BEING OUTPUT FROM THE FIRST MIXING DEVICE 1404

ISOLATOR BASED ON NONDEGENERATE THREE-WAVE MIXING JOSEPHSON DEVICES

STATEMENT REGARDING PRIOR DISCLOSURES BY THE INVENTOR OR A JOINT INVENTOR

The following disclosure is submitted under 35 U.S.C. 102(b)(1)(A): DISCLOSURE: "Demonstrating A Gyrator Operation Using Josephson Mixers" by Baleegh Abdo, Markus Brink, and Jerry M. Chow, made publicly available Feb. 3, 2017, which is herein incorporated by reference.

BACKGROUND

The present invention generally relates to superconducting devices. More specifically, the present invention relates to isolators based on nondegenerate three-wave mixing Josephson devices.

An isolator is a two-port device that transmits microwave or radio frequency power in one direction only. It is used to shield equipment on its input side, from the signals or noise coming from its output side. An isolator is a non-reciprocal device, with a non-symmetric scattering matrix and two ports. A port in this context is a plane where an external waveguide or transmission line (such as a microstrip line or a coaxial cable) connects to the device. An ideal isolator transmits all the power entering port 1 to port 2, while absorbing all the power entering port 2 destined for port 1. In other words, a signal applied to port 1 only comes out of port 2. However, a signal applied to port 2 is blocked from coming out of port 1. Within a phase-factor, the scattering matrix for an ideal frequency-preserving two-port isolator is $$[S] = \begin{pmatrix} 0 & 0 \\ 1 & 0 \end{pmatrix}.$$

To achieve non-reciprocity, an isolator incorporates a non-reciprocal material. At microwave frequencies, this material is generally a ferrite that is biased by a static magnetic field. The ferrite is positioned within the isolator such that the microwave signal presents it with a rotating magnetic field, with the rotation axis aligned with the direction of the static bias field. The behavior of the ferrite depends on the sense of rotation with respect to the bias field, and hence is different for microwave signals travelling in opposite directions. Depending on the exact operating conditions, the signal travelling in one direction can either be phase-shifted, displaced from the ferrite, or absorbed.

Isolators are used in conjunction with superconducting circuits. New isolators are needed for superconducting applications without the constraints of current isolators that are based on magnetic materials and strong magnetic fields.

SUMMARY

Embodiments of the present invention are directed to superconducting device. A non-limiting example of the superconducting device includes a gyrator including a first mixing device coupled to a second mixing device, and a lumped-element resistor connected in parallel to the gyrator.

Embodiments of the present invention are directed to a method of forming a superconducting device. A non-limiting example of the method of forming the superconducting device includes forming a gyrator including a first mixing device coupled to a second mixing device, and coupling a lumped-element resistor in parallel to the gyrator.

Embodiments of the present invention are directed to a superconducting device. A non-limiting example of the superconducting device includes a first mixing device having a first mixing port and a second mixing port, and a second mixing device having another first mixing port and another second mixing port. The first and second mixing devices are superconducting three-wave mixing devices, and the second mixing port and the another second mixing port are coupled together via a delay line to form a gyrator. Also, the superconducting device includes a lumped-element resistor coupled in parallel to the gyrator.

Embodiments of the present invention are directed to method of fabricating a superconducting device. A non-limiting example of the method of fabricating the superconducting device includes providing a first mixing device having a first mixing port and a second mixing port and a second mixing device having another first mixing port and another second mixing port. The first and second mixing devices are superconducting three-wave mixing devices. Also, the method includes coupling the second mixing port and the another second mixing port together via a delay line to form a gyrator, and coupling a lumped-element resistor in parallel to the gyrator.

Embodiments of the present invention are directed to a method of operating a superconducting isolator. A non-limiting example of the method of operating the superconducting isolator includes receiving a signal at a first mixing device coupled to a second mixing device. The first and second mixing devices are coupled in parallel to a lumped-element resistor. The method includes outputting the signal from the second mixing device, where any signal received at the second mixing device is blocked from being output from the first mixing device.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 14 depicts a flow chart of a method of operating a superconducting isolator according to embodiments of the present invention.

Figure 1:
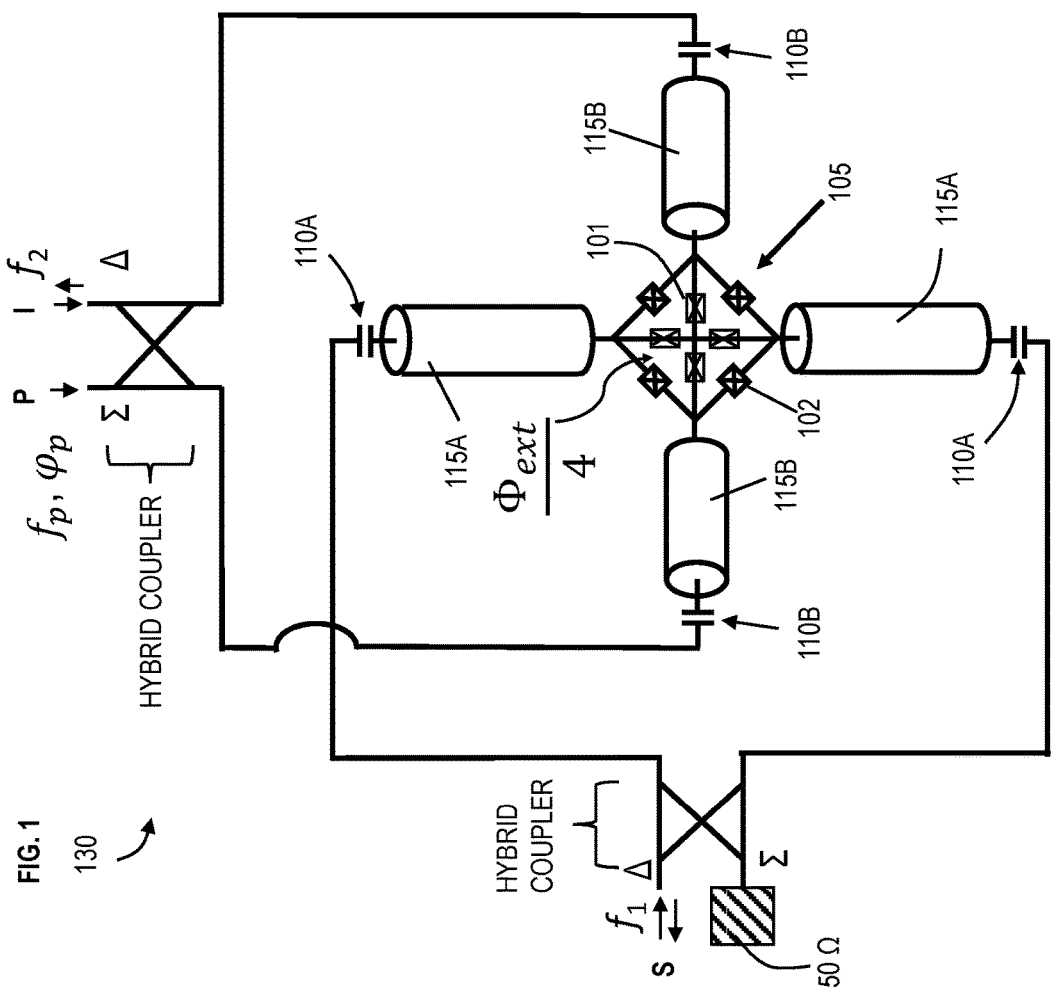
FIG. 1 depicts a schematic of a superconducting nondegenerate three-wave mixing device according to embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor and/or superconducting devices and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor and/or superconducting devices and semiconductor/superconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, progress in solid-state quantum information processing has motivated the search for amplifiers and frequency converters with quantum-limited performance in the microwave domain. Depending on the gain applied to the quadratures of a single spatial and temporal mode of the electromagnetic field, linear amplifiers can be classified into two categories which are phase sensitive and phase preserving, each having fundamentally different noise properties. Phase-sensitive amplifiers squeeze the input noise and signal in one quadrature of the microwave field at the expense of inflating the noise and signal in the other quadrature without adding noise of their own to the processed signal. However, phase-sensitive amplifiers are useful only in cases in which the quantum information is encoded in one quadrature of the microwave field. A phase-preserving amplifier on the other hand amplifies both quadratures of the input noise and signal at the expense of adding at least a noise equivalent to a half input photon at the signal frequency. Such an amplifier would be useful in many quantum applications, including qubit readout. One realization of a nondegenerate intrinsically phase-preserving superconducting parametric amplifier is based on a Josephson ring modulator. A Josephson ring modulator can include four Josephson junctions in a Wheatstone bridge configuration. The device symmetry enhances the purity of the amplification process, i.e., eliminates or minimizes certain undesired nonlinear processes, and also simplifies both its operation and its analysis.

Commercial cryogenic isolators are utilized in quantum applications. However, commercial cryogenic circulators are typically large in size, heavy in weight, and hard to thermalize. Additionally, commercial cryogenic isolators use ferrites which are difficult to fabricate/integrate on chip and incorporate magnets which can have negative effects on superconducting circuits. In a standard 1 input 1 output line setup, which connects 1 qubit-resonator and 1 quantum-limited amplifier, such as the Josephson parametric converter (JPC), the state-of-the-art uses two about circulators and three isolators.

Turning now to an overview of the aspects of the invention, one or more embodiments of the invention address the above-described shortcomings of the prior art by providing a superconducting two-port isolator configured to transmit microwave signals propagating in one direction with unity transmission, and attenuate (or block) the signals propagating in the opposite direction. The isolator is formed by a gyrator in parallel to a lumped-element resistor. The gyrator is realized using two nondegenerate three-wave mixing Josephson devices coupled back-to-back. That is, the gyrator can be formed of two up conversion/down conversion stages. The isolator works by operating the two nondegenerate three-wave mixing devices in noiseless frequency conversion mode (i.e., no photon gain) and setting their working point to full conversion, in which reflections off the ports are minimized and the transmission with frequency up conversion/down conversion to the other port is maximized. There is a phase difference between the pump drives feeding the two nondegenerate three-wave mixing Josephson devices, and this phase difference between the pump drives introduces a non-reciprocal phase shift to the signals propagating across each device. A delay line is incorporated between the two up conversion/down conversion stages or symmetrically half of the delay line after the first stage and half before the second stage. The delay of the delay line is calibrated such that the phase added to the propagating waves due to this delay when combined with the nonreciprocal phase shift introduced by the two nondegenerate three-wave mixing Josephson devices yields a zero phase shift in one direction of wave propagation and 180 degree phase shift in the opposite direction. In the direction of no added phase, the propagating waves do not see the on-chip parallel lumped-element resistor, and therefore no power dissipation occurs. In contrast, in the direction of the 180 degree shift, the propagating waves maximally see the on-chip parallel lumped-element resistor, and therefore a large portion of its power is dissipated in the lumped-element resistor leading to isolation in this direction (e.g., about 20 decibels (dB) attenuation)).

More specifically, the above-described aspects of the invention address the shortcomings of the prior art by providing a superconducting two-port isolator based at least in part on nondegenerate three-wave mixing Josephson devices. According to embodiments of the invention, the technical effects and benefits of the two-port isolator are that it can be integrated on chip or into a printed circuit board (PCB), does not use ferrites, and does not require magnets (with large magnetic fields). Also, the isolator can be thermalized well, can be made small/compact, and has lighter weight. Further, the direction of isolation can be reversed in situ by negating the phase difference between the two pump tones feeding the two nondegenerate three-wave mixing devices. In other words, the phase applied by the pump drives can be reversed in each nondegenerate three-wave mixing Josephson device.

Turning now to a more detailed description of aspects of the present invention, FIG. 1 depicts a schematic of a superconducting nondegenerate three-wave mixing device 130 according to embodiments of the invention. The superconducting nondegenerate three-wave mixing device 130 can be a Josephson parametric converter (as one example). The Josephson parametric converter 130 includes a Josephson ring modulator (JRM) 105 which is a nonlinear dispersive element based on Josephson tunnel junctions 102 that can perform three-wave mixing of microwave signals at the quantum limit. The three microwave signals are generally referred to as the Signal microwave signal, Idler microwave signal, and Pump microwave signal. The JRM 105 consists of four nominally identical Josephson junctions 102 arranged in a Wheatstone bridge configuration. The JRM 105 can also include four nominally identical Josephson junction 101 connected at the intersections of the Josephson junction 102. In some implementations, the Josephson junctions 101 can be identical to the Josephson junction 102. In other implementations, the Josephson junction 101 can be different from the Josephson junctions 102. In some implementations, the JRM 105 may or may not include the Josephson junctions 101.

In order to construct a nondegenerate three-wave mixing parametric device (the Josephson parametric converter 130), which is capable of amplifying and/or mixing microwave signals at the quantum limit, the JRM 105 is incorporated into two microwave resonators at a radio frequency (RF) current anti-node of the multiple of their eigenmodes. The JRM 105 is driven by external flux, which is $\Phi_{ext}$. The external flux can be applied using an on-chip flux line, using external magnetic coil, and/or using a very small magnetic material integrated on-chip or in the package. In one implementation, the pump drive (i.e., Pump microwave signal) can be applied using an on-chip flux line, using an on-chip three-port power divider, and/or using a weakly coupled feedline.

One of the microwave resonators is Signal (S) resonator 115A and the other is an Idler (I) resonator 115B. The device is nondegenerate because the Signal microwave signal and the Idler microwave signal are input at separate ports and have different frequencies. A coupling capacitor 110A connects the resonator 115A to a hybrid coupler while the coupling capacitor 110B connects the resonator 115B to a hybrid coupler. The hybrid couplers are off-chip/on-chip broadband 180 degree hybrids. The Josephson parametric converter 130 includes both the resonator 115A and resonator 115B, along with the JRM 105. The Signal (S) resonator 115A has a resonance frequency $f_1$ (also referred to as $f_S$) and the Idler (I) resonator 115B has a resonance frequency $f_2$ (also referred to as $f_I$). Embodiments of the present invention can include the case in which the Josephson parametric converter 130 is hybrid-less, and this means that the Josephson parametric converter 130 does not require hybrids for its operation, i.e., signal delivery to and from the device 130. On the other hand, embodiments of the present invention can include the case in which the Josephson parametric converter 130 is not hybrid-less, and this means that the Josephson parametric converter 130 does require hybrids for its operation, i.e., signal delivery to and from the device 130.

The performances (namely power gain G, dynamical bandwidth $\gamma$, and maximum input power $P_{max}$) of the Josephson parametric converter 130 are strongly dependent on the critical current $I_0$ (also referred to as $I_c$) of the Josephson junctions 102 of the JRM 105, the specific realization of the electromagnetic environment (i.e., the microwave resonator 115A and microwave resonator 115B), the coupling between the JRM 105 and the resonators 115A and 115B, and the coupling between the resonators to the feedlines. Feedlines are the transmission lines that connect the resonators 115A and 115B to the two hybrid couplers. The transmission lines connecting the resonators 115A and 115B to the two hybrid couplers can be microwave coaxial lines or waveguides. Although not shown, other devices can be connected to the opposite end of the hybrid couplers. Examples of the other devices can include attenuators, circulators, isolators, low-pass microwave filters, bandpass microwave filters, infrared filters, and qubit-cavity systems.

Figure 2:
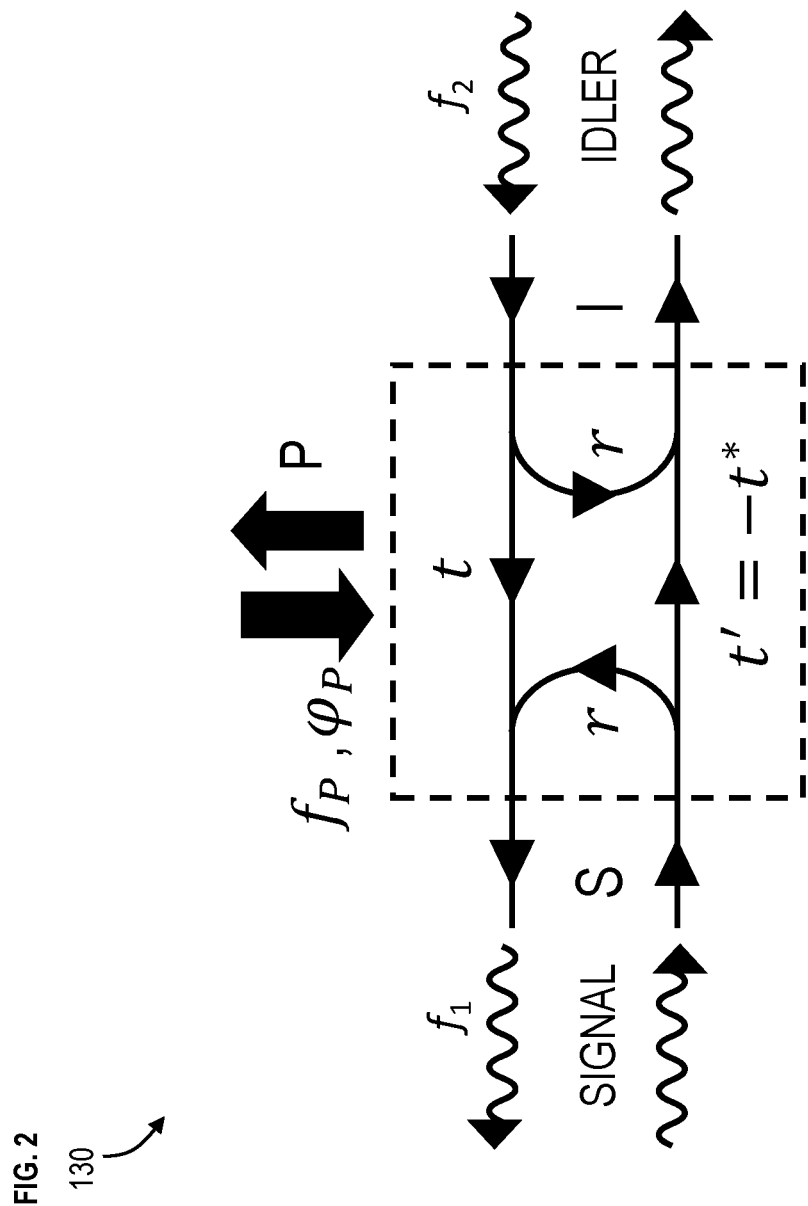
FIG. 2 depicts a signal flow graph of a superconducting nondegenerate three-wave mixing device according to embodiments of the present invention.

FIG. 2 depicts a signal flow graph of the superconducting nondegenerate three-wave mixing device 130 operated in frequency conversion mode according to embodiments. In frequency conversion mode, there is no photon gain. That is, the superconducting nondegenerate three-wave mixing device 130 is not operated as an amplifier. FIG. 2 depicts the signal flow graph for the nondegenerate three-wave mixing device 130. The Josephson parametric converter 130 satisfies the following scattering matrix when operated in noiseless frequency conversion:

$$[S] = \begin{pmatrix} r & t \\ t' & r \end{pmatrix} = \begin{pmatrix} \cos\theta & ie^{i\varphi_P}\sin\theta \\ ie^{-i\varphi_P}\sin\theta & \cos\theta \end{pmatrix}.$$

As recognized herein, the phase of the pump $\varphi_p$ will be utilized in accordance embodiments. Because the scattering matrix is unitary, the following relation holds $$|r|^2 + |t|^2 = 1,$$

where r is the reflection coefficient, t is the transmission parameter, and $t' = -t^*$ (where $t^*$ is the conjugate of t). Unitary means that the device 130 preserves the energy and the coherence of the phase. The full conversion working point of the superconducting nondegenerate three-wave mixing device 130 is $$|r|^2 = 0, |t|^2 = 1.$$

At the full conversion working point, there is no reflection and there is full transmission with frequency conversion.

In FIG. 2, the superconducting nondegenerate three-wave mixing device 130 has 3 ports, which are the Signal port (S), the Idler port (I), and the Pump port (P). The superconducting nondegenerate three-wave mixing device 130 has transmission t from Idler port to Signal port and transmission t' from Signal port to Idler port. From Idler to Signal port, the Idler microwave signal enters the Idler port at frequency $f_2$, is down converted, and exits the Signal port at frequency $f_1$. From Signal to Idler port, the Signal microwave signal enters the Signal port at frequency $f_1$, is up converted, and exits the Idler port at frequency $f_2$. The pump microwave signal provides the energy for frequency up conversion and frequency down conversion. The pump frequency is $f_p$, where $$f_P = f_I - f_S = f_2 - f_1.$$

Figure 3:
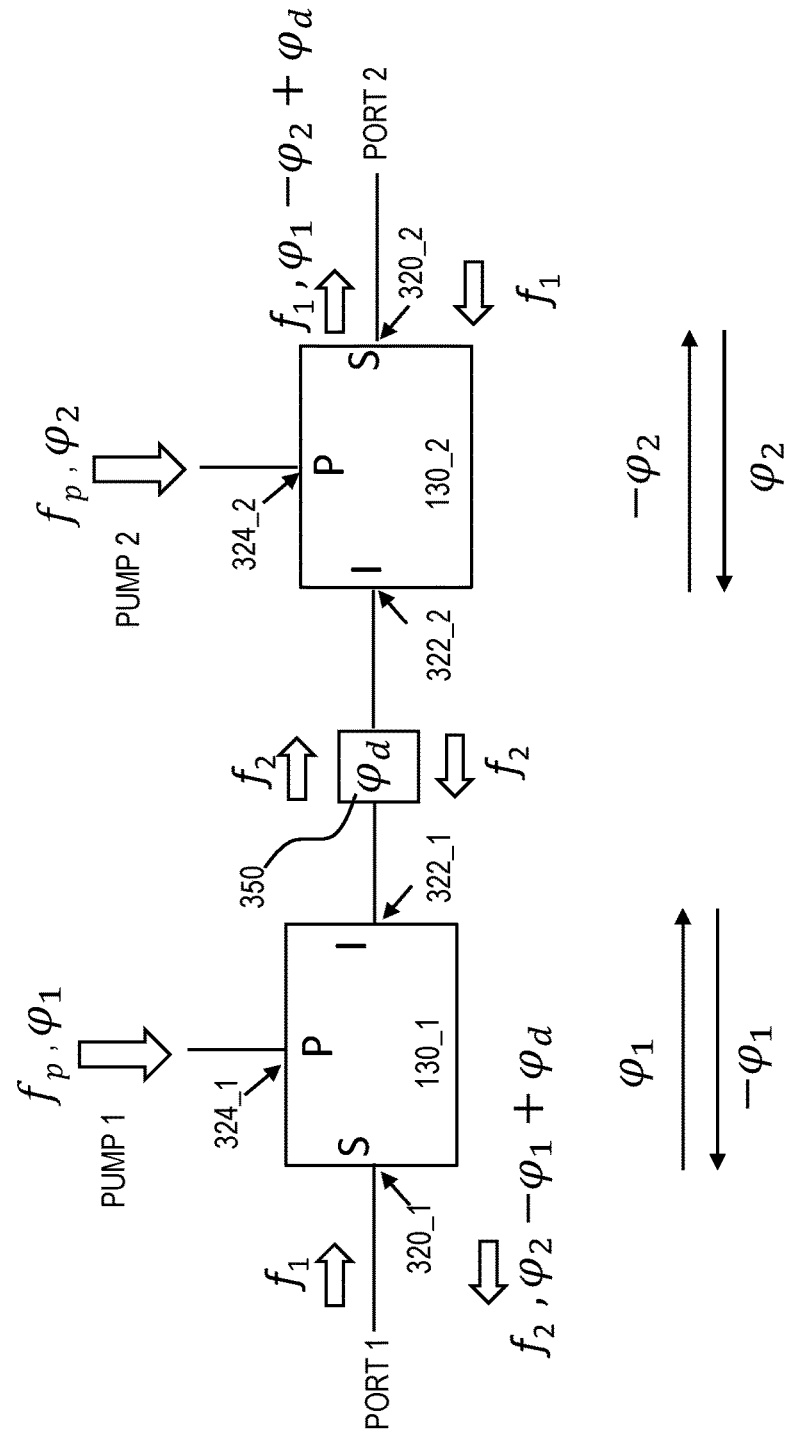
FIG. 3 depicts a schematic of an on-chip superconducting nonreciprocal phase shifter according to embodiments of the present invention.
Figure 4:
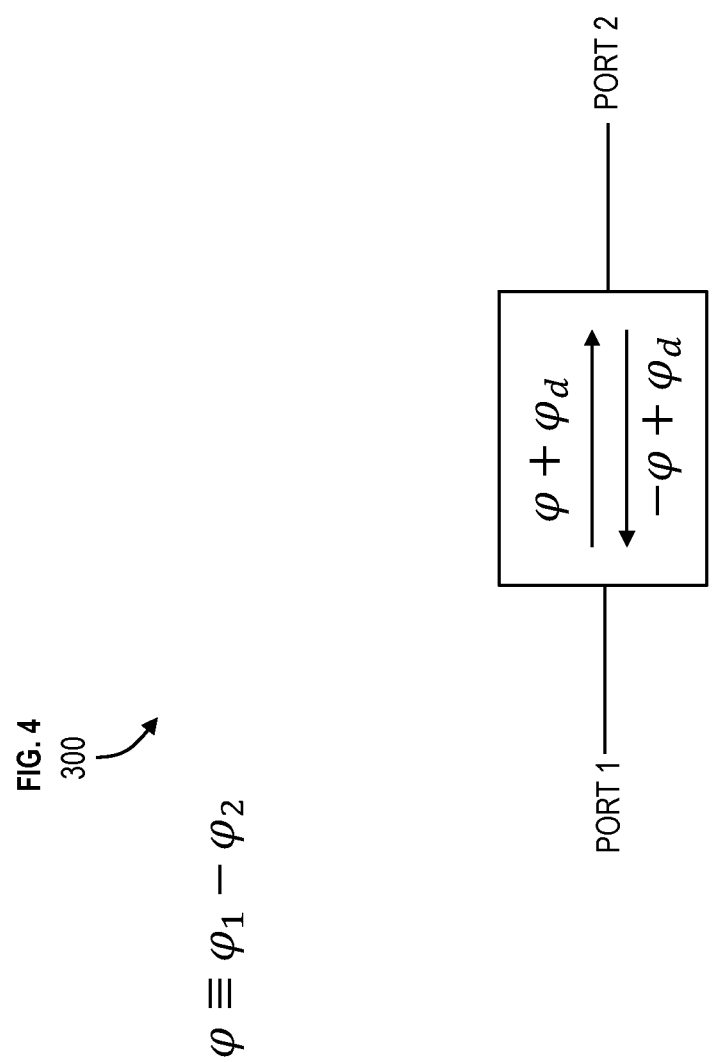
FIG. 4 depicts a black box representation of the superconducting nonreciprocal phase shifter according to embodiments of the present invention.
Figure 5:
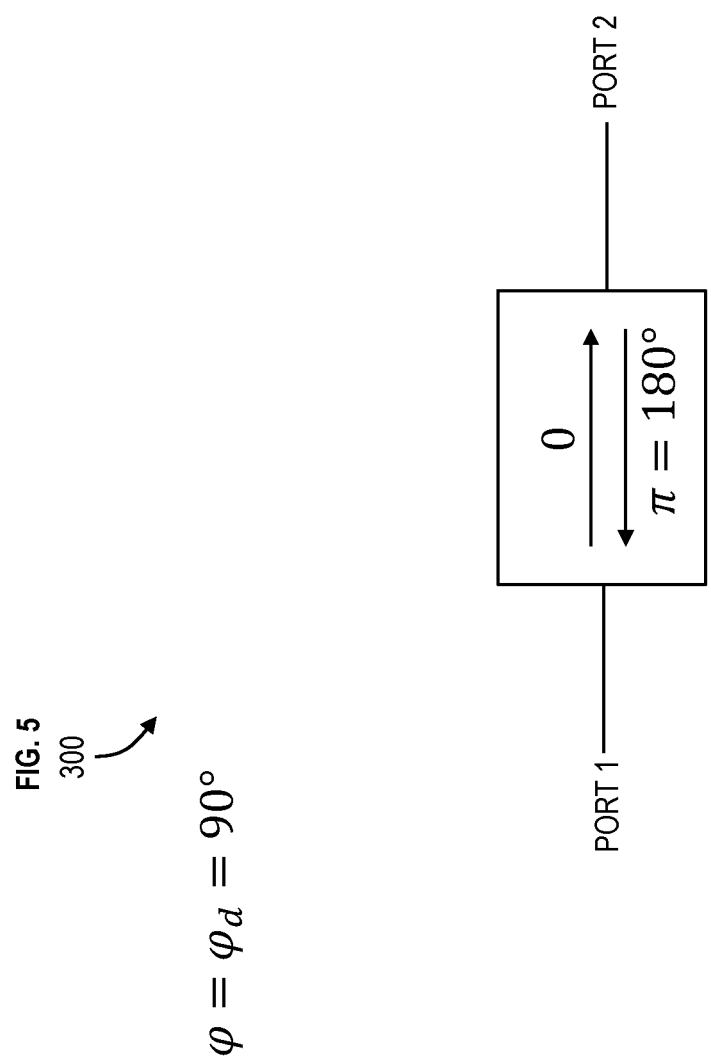
FIG. 5 depicts a black box representation of the superconducting nonreciprocal phase shifter according to embodiments of the present invention.

FIG. 3 depicts a schematic of an on-chip superconducting nonreciprocal phase shifter 300 according to embodiments of the present invention. FIG. 4 depicts a (black box) view of the superconducting nonreciprocal phase shifter 300 according to embodiments of the present invention. FIG. 5 depicts a (black box) view of the superconducting gyrator 300 in which $\varphi = \varphi_d = 90°$ according to embodiments of the present invention.

The on-chip superconducting nonreciprocal phase shifter 300 includes two superconducting nondegenerate three-wave mixing devices 130 coupled together in series. The two superconducting nondegenerate three-wave mixing devices are designated as superconducting nondegenerate three-wave mixing devices 130_1 and 130_2, which operate the same as superconducting nondegenerate three-wave mixing devices 130 discussed herein.

The superconducting nondegenerate three-wave mixing devices 130_1 and 130_2 are (nominally) identical. The superconducting nondegenerate three-wave mixing devices 130_1 and 130_2 have respective ports 320_1 and 320_2 (which can be Signal ports connected to Signal resonators having the resonance frequency $f_1$). The superconducting nondegenerate three-wave mixing devices 130_1 and 130_2 have respective ports 322_1 and 322_2 (which can be Idler ports connected to Idler resonators having the resonance frequency $f_2$). The superconducting nondegenerate three-wave mixing devices 130_1 and 130_2 have ports 324_1 and 324_2 (which can be pump ports designed to receive the pump frequency $f_p$). The microwave pump signal at pump frequency $f_p$ can be applied to the signal resonator or the idler resonator through one of the $\Sigma$ ports of the hybrids or directly (without hybrids) through a separate physical port (as was demonstrated recently in several hybrid-less JPC circuits (in the state-of-the-art)). For the superconducting nondegenerate three-wave mixing device 130_1, the microwave pump signal is applied to port 324_1 at pump frequency $f_p$ and phase $\varphi_1$. For the superconducting nondegenerate three-wave mixing device 130_2, the microwave pump signal is applied to port 324_2 at pump frequency $f_p$ and phase $\varphi_2$. The pump frequency $f_p$ is $f_P = |f_2 - f_1|$ is the same for the microwave pump signals input to both three-wave mixing devices 130_1 and 130_2, where, without loss of generality, $f_2 > f_1$.

The three-wave mixing devices 130_1 and 130_2 have (Signal ports) ports 320_1 and 320_2, respectively. In the nonreciprocal phase shifter 300, (Signal) port 320_1 is denoted as port 1, and (Signal) port 320_2 is denoted as port 2. The three-wave mixing devices 130_1 and 130_2 have (Idler ports) ports 322_1 and 322_2, respectively. The three-wave mixing devices 130_1 and 130_2 are connected back-to-back, for example, via their Idler ports. Particularly, ports 322_1 and 322_2 (of three-wave mixing device 130_1 and 130_2) are coupled together. In some embodiments, a delay line 350 can be added between three-wave mixing devices 130_1 and 130_2. The delay line 350 is configured to add phase shift $\varphi_d$ to signals (waves) propagating in both directions at frequency $f_2$ between ports 322_1 and 322_2 of the three-wave mixing devices 130_1 and 130_2.

The superconducting nondegenerate three-wave mixing devices 130_1 and 130_2 are both operated at their full conversion working point where reflection r is 0 and transmission |t| is 1 and operated in frequency conversion (i.e., not as an amplifier with photon gain). The operation mode of the devices 130_1 and 130_2 is unitary frequency conversion mode (without photon gain) in which the applied pump frequency $f_p$ satisfies the relation $f_P = |f_I - f_S| = |f_2 - f_1|$.

The three-wave mixing device 130_1 adds phase shift $\varphi_1$. This means that there is a positive (+) phase shift $\varphi_1$ added to the transmitted signal from port 320_1 to port 322_1 during up conversion, and there is a negative (−) phase shift $-\varphi_1$ added from port 322_1 to port 320_1 during down conversion by the three-wave mixing device 130_1. Analogously, the three-wave mixing device 130_2 adds phase shift $\varphi_2$. Accordingly, there is a positive (+) phase shift $\varphi_2$ added from port 320_2 to port 322_2 during up conversion, and there is a negative (−) phase shift $-\varphi_2$ added from port 322_2 to port 320_2 during down conversion by the three-wave mixing device 130_2.

More details of the operation of the superconducting nonreciprocal phase shifter 300 are now provided. A nonreciprocal phase shifter scheme is used to demonstrate gyrator operation, employing the two dissipationless nondegenerate three-wave mixers 130_1 and 130_2. The general scheme for the two-port nonreciprocal phase shifter/gyrator 300 is depicted in FIG. 3. The gyrator 300 consists of two unitary frequency conversion stages (i.e., three-wave mixers 130_1 and 130_2) connected together by a transmission line (e.g., delay line 350). Example scenarios are provided below in the first direction (i.e., forward direction) and the second direction (backward direction).

In the first direction designated as entering port 1 and eventually exiting port 2, incoming signals at frequency $f_1$ on port 1 (i.e., port 320_1) of the nonreciprocal phase shifter 300 are up converted using the first frequency conversion stage (i.e., the three-wave mixing device 130_1) to frequency $f_2$ ($f_2 > f_1$) and have a phase shift $\varphi_1$ added (in the first direction). The signal at frequency $f_2$ with phase $\varphi_1$ is transmitted (from port 322_1) via the transmission line (e.g., delay line 350) to port 322_2 of the second frequency conversion stage (three wave mixing device 130_2). By propagating (traveling) on the delay line 350, the signal at frequency $f_2$ adds phase $\varphi_d$, thereby resulting in the signal at frequency $f_2$ having phase $\varphi_1 + \varphi_d$. The signal at frequency $f_2$ having phase $\varphi_1 + \varphi_d$ is transmitted from/via delay line 350 to the second frequency conversion stage, which down converts the signal (previously at $f_2$) back to $f_1$, and the second frequency conversion stage (three-wave mixing device 130_2) is configured to add phase $-\varphi_2$ (based on the traveling in the first direction), thereby resulting in down converted signal at frequency $f_1$ with phase $\varphi_1 - \varphi_2 + \varphi_d$. Then, the signal at frequency $f_1$ having phase $\varphi_1 - \varphi_2 + \varphi_d$ exits through port 2 (i.e., port 320_2).

Now turning to the second direction designated as entering port 2 and eventually exiting port 1, incoming signals at frequency $f_1$ on port 2 (i.e., port 320_2) of the nonreciprocal phase shifter 300 are up converted using the second frequency conversion stage (i.e., the three wave mixing device 130_2) to frequency $f_2$ ($f_2 > f_1$) and have a phase shift $\varphi_2$ added (in the second direction). The signal at frequency $f_2$ with phase $\varphi_2$ is transmitted (from port 322_2) via the transmission line (e.g., delay line 350) to port 322_1 of the second frequency conversion stage (three-wave mixing device 130_1). For example, by propagating (traveling) on the delay line 350, the signal at frequency $f_2$ adds phase $\varphi_d$, thereby resulting in the signal at frequency $f_2$ having phase $\varphi_2+\varphi_d$. The signal at frequency $f_2$ having phase $\varphi_2+\varphi_d$ is transmitted from/via delay line 350 to the first frequency conversion stage, which down converts the signal (previously at $f_2$) back to $f_1$, and the first frequency conversion stage (three-wave mixing device 130_1) is configured to add phase $-\varphi_1$ (based on the traveling in the second direction), thereby resulting in the down converted signal at frequency $f_1$ with phase $\varphi_2-\varphi_1+\varphi_d$. Then, the signal at frequency $f_1$ having phase $\varphi_2-\varphi_1+\varphi_d$ exits through port 1 (i.e., port 320_1).

Both frequency conversion processes taking place in the gyrator 300, i.e., up conversion and down conversion, are enabled via energy exchange with the pump drives feeding the two mixing stages at a certain power, and whose frequency $f_p$ corresponds to the frequency difference $f_p=f_2-f_1$. In addition to the role played by the pump power and frequency in the operation of the gyrator 300, the pump phase ($\varphi_1$ for pump 1 and $\varphi_2$ for pump 2) plays a pivotal role. As depicted in FIG. 4, the pump phase controls the nonreciprocal phase shift experienced by the transmitted signals from port 1 to port 2, i.e., $\varphi+\varphi_d$, versus the phase shift acquired in the opposite direction from port 2 to port 1, i.e., $-\varphi+\varphi_d$. In FIG. 4, $\varphi\equiv\varphi_1-\varphi_2$ is the phase difference between the two pump drives (i.e., pump 1 and pump 2) feeding the two mixing stages (three-wave mixing devices 130_1 and 130_2) and $\varphi_d$ is the phase shift introduced by the connecting components. FIG. 4 exhibits a black box representation of the nonreciprocal phase shifter 300, which emphasizes the nonreciprocal phase shift introduced by the device 300 and its dependence on the phase difference between the two pump drives feeding the system. To have a 0° phase from port 1 to port 2 (first direction) and to have a 180° from port 2 to port 1 (second direction), FIG. 5 shows the gyrator 300 defined with the relation $\varphi=\varphi_d=90°$.

Figure 6:
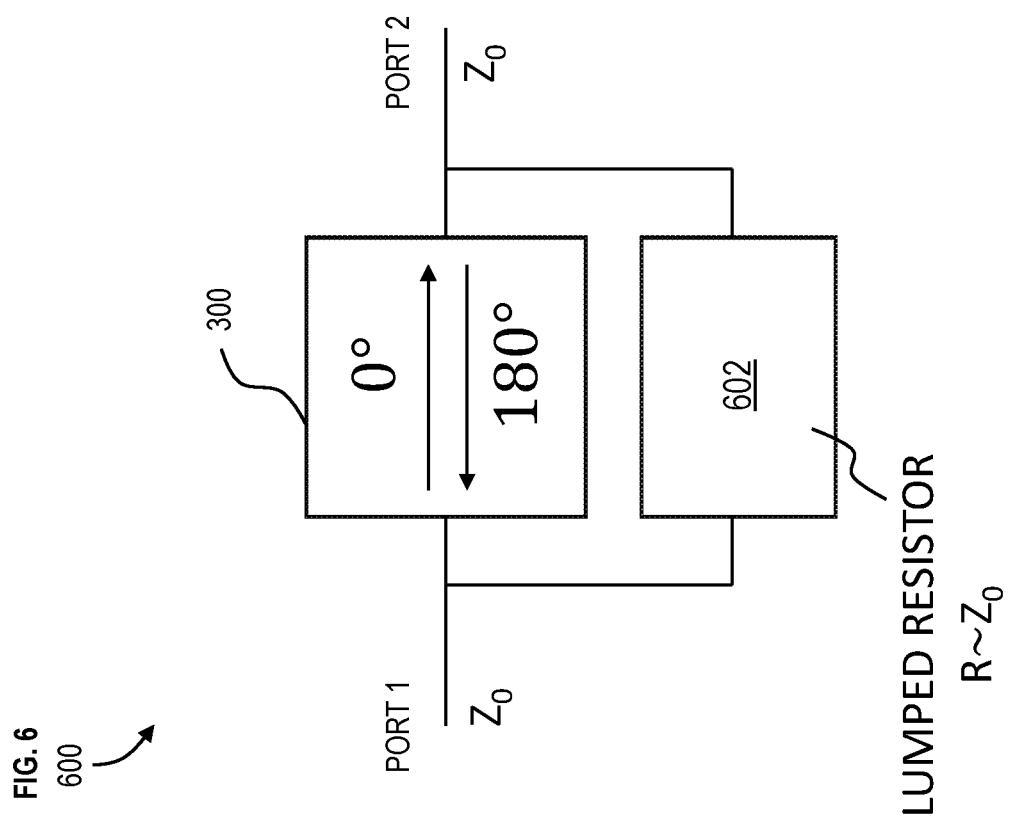
FIG. 6 depicts a superconducting isolator according to embodiments of the present invention.

FIG. 6 depicts a superconducting isolator 600 according to embodiments of the present invention. The on-chip isolator 600 is based on superconducting Josephson mixing devices. The superconducting isolator 600 includes the gyrator 300 connected in parallel to (i.e., shunted by) a lumped-element resistor 602. As noted above, the gyrator 300 includes the two nondegenerate three-wave mixing devices 130_1 and 130_2 connected back-to-back, operated in full conversion mode and driven by certain pump signals such that it functions as a gyrator (i.e., has a differential phase shift of 180° between its two ports).

Lumped-element resistors are used in RF, microwave, and millimeter wave circuits. The design of these resistors requires a knowledge of sheet resistance, thermal resistance, current-handling capacity, nominal tolerances, and temperature coefficient of the film of the lumped-element resistor 602. These lumped-element resistors can be realized either by depositing thin films of lossy material on a dielectric base using thin-film, thick-film, or monolithic technologies or by employing semiconductor films on a semi-insulating substrate between two electrodes. Nichrome and tantalum nitride are the most popular and useful film materials for thin-film resistors. It should be noted that the material used for realizing the resistor 602 does not become superconducting at the operating temperature of the device 600. Moreover, the lumped-element resistor 602 is not superconducting and it is lossy. The gyrator 300 is a superconducting device. The superconducting isolator 600 is superconducting in the designed direction from port 1 to port 2 such that current is allowed to pass without power dissipation because the lumped-element resistor 602 has no affect.

Figure 7:
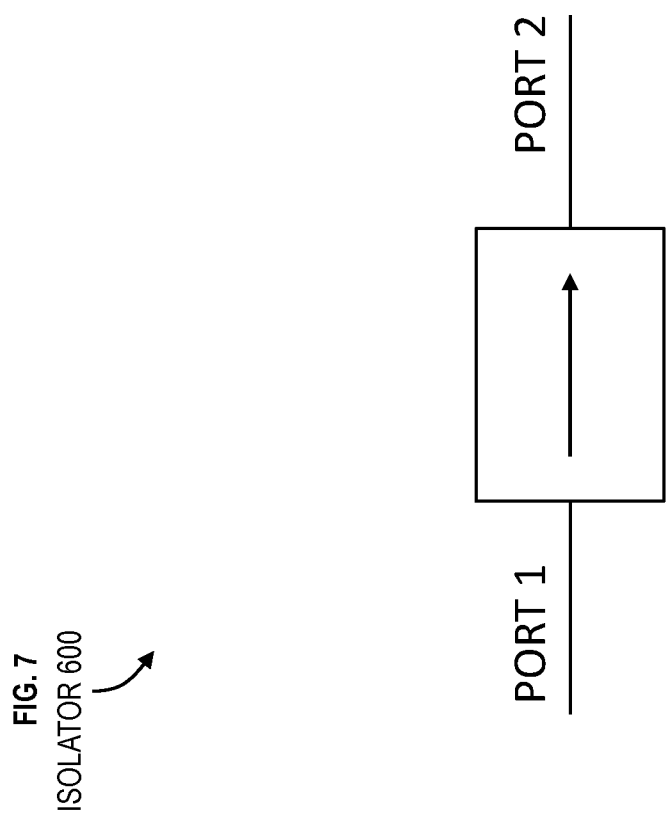
FIG. 7 depicts a black box representation of the superconducting isolator according to embodiments of the present invention.

As seen in FIG. 6, the port 1 which is the input port and port 2 which is the output port both have characteristic impedance $Z_0$. Additionally, the lumped-element resistor 602 has a resistance R that is about $Z_0$. For example, the lumped-element resistor 602 can be a thin-film metallic layer with resistance $Z_0$. FIG. 7 depicts a black box representation of the superconducting isolator 600 according to embodiments of the present invention. FIG. 7 shows that the isolator 600 is designed to allow signals to enter port 1 and exit port 2 but does not allow signals to enter port 2 and exit port 1.

Figure 8:
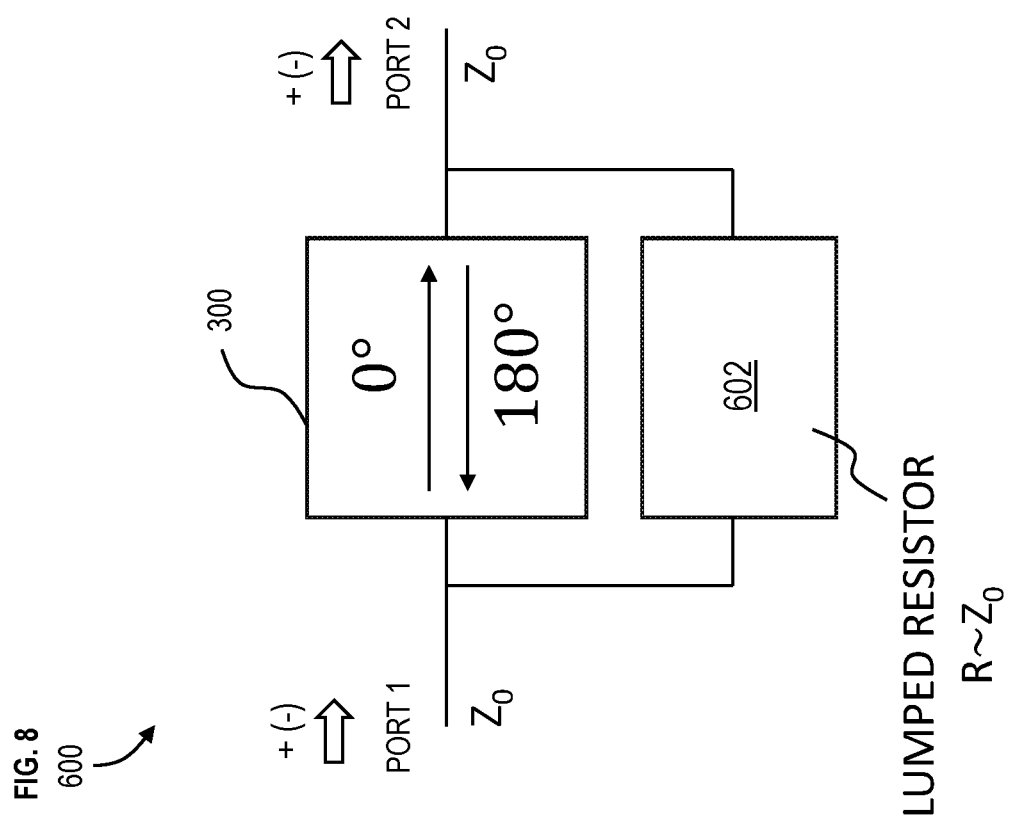
FIG. 8 depicts operating the superconducting isolator in the forward direction according to embodiments of the present invention.
Figure 9:
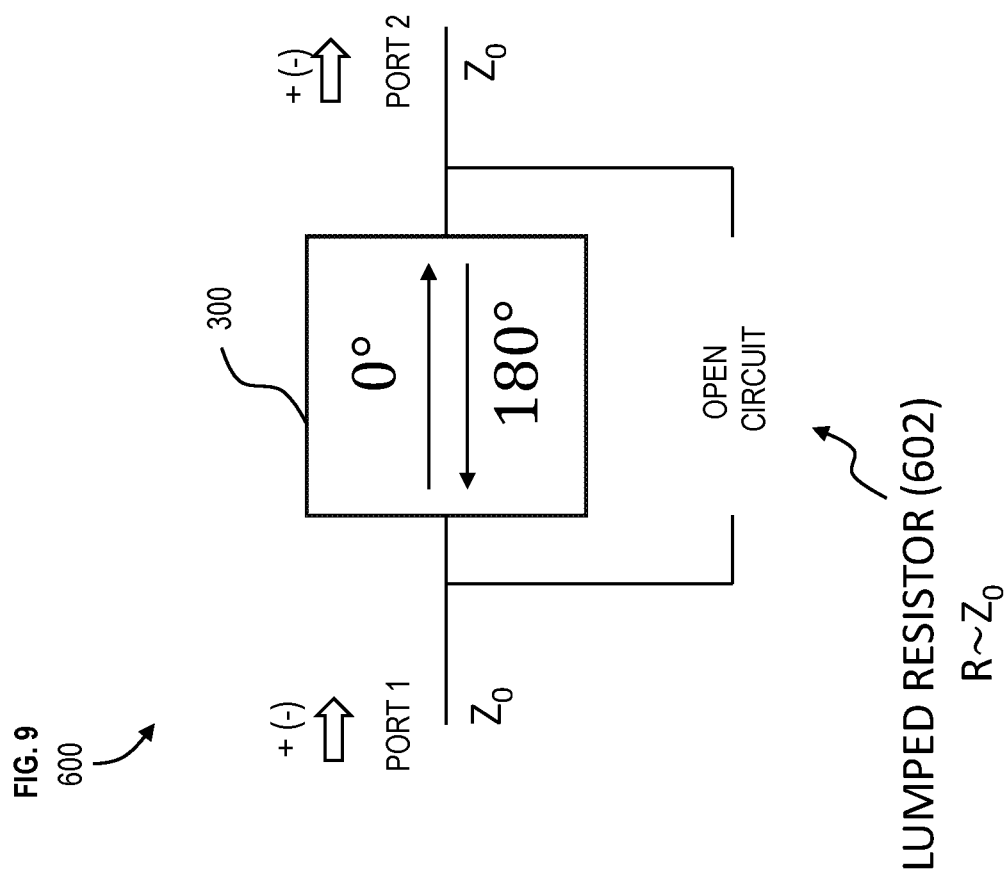
FIG. 9 depicts an equivalent circuit of the isolator according to embodiments of the present invention.
Figure 11:
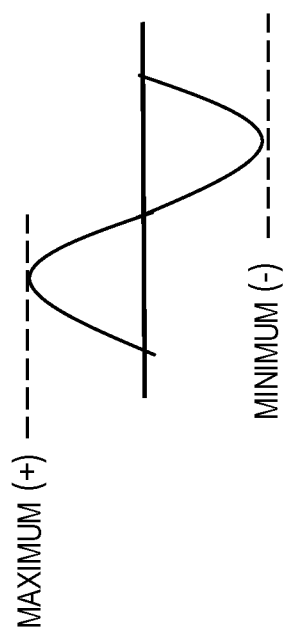
FIG. 11 depicts an example sinusoidal wave with peak/maximum and valley/minimum according to embodiments of the invention.

Now turning to the details of operating the isolator 600, FIG. 8 depicts operating in the first direction from port 1 to port 2 according to embodiments of the present invention. The signal (waves) entering port 1 (i.e., Signal port 320_1) of the isolator 600 has the same phase (i.e., polarity) when exiting port 2 (i.e., Signal port 320_2) of the isolator 600. Because there is a 0° phase shift on the signal entering port 1 (i.e., port 320_1), no (radio frequency) current flows in the lumped-element resistor 602, and no power dissipation occurs in the lumped-element resistor 602. Accordingly, the lumped-element resistor 602 can be neglected and the signal entering port 1 is transmitted to port 2 of the isolator 600. For the first direction from port 1 to port 2, FIG. 9 depicts an equivalent circuit of the isolator 600 in which the lumped-element resistor 602 is replaced by an open circuit (O.C.) according to embodiments of the present invention. In the first scenario, the input signal has a phase that is a maximum (+) entering port 1 (i.e., port 320_1) of the isolator 600, and because there is no phase change (0°) occurring in the gyrator 300 in the first direction, the signal correspondingly exits from port 2 with a phase that is a maximum (+). Therefore, there is no voltage drop across port 1 and port 2 because the signal has a phase that is a maximum (+) when both entering and exiting the isolator 600, and accordingly, no current flows through the lumped-element resistor 602, and thus no power is dissipated in the resistor. To help illustrate this point, FIG. 11 depicts a sinusoidal wave with a maximum (+) as the peak and a minimum (−) as the valley. In this scenario, the signal entering port 1 and exiting port 2 has the same phase/polarity corresponding to a maximum.

In the second scenario, the signal entering port 1 and exiting port 2 has the same phase/polarity which corresponds to a minimum (−). In the second scenario for the first direction, the input signal has a phase that is a minimum (−) entering port 1 (i.e., port 320_1) of the isolator 600, and because there is no phase change (0°) occurring in the gyrator 300 in the first direction, the signal correspondingly exits from port 2 with a phase that is a minimum (−). Just as in the first scenario, there is no voltage drop across port 1 and port 2 because the signal has a phase that is a minimum (−) when both entering and exiting the isolator 600, and accordingly, no current flows through the lumped-element resistor 602, and thus no power is dissipated in the resistor 602.

Figure 10:
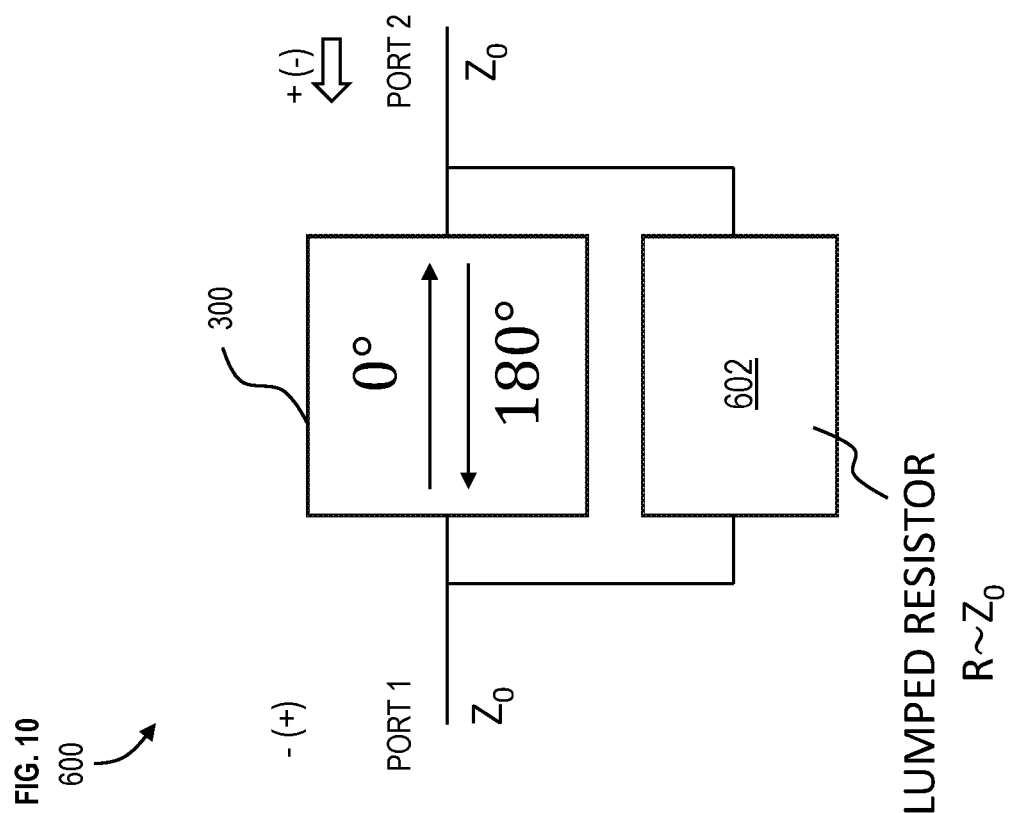
FIG. 10 depicts operating the superconducting isolator in the backward direction according to embodiments of the present invention.

FIG. 10 depicts operating in the backward direction (i.e., second direction) from port 2 to port 1 according to embodiments of the present invention. The signal (waves) entering port 2 (i.e., Signal port 320_2) of the isolator 600 has a different phase (i.e., polarity) than when it would be exiting port 1 (i.e., Signal port 320_1) of the isolator 600. Because there is a 180° phase difference between the signal entering port 2 (i.e., port 320_2), (radio frequency) and the signal exiting port 1, current flows in the lumped-element resistor 602, and power dissipates in the lumped-element resistor 602. Accordingly, the signal is attenuated from port 2 to port 1, thus the signal is effectively blocked in the backward direction (second direction).

The following third and fourth scenarios are provided below. In the third scenario, the input signal has a phase that is a minimum (−) entering port 2 (i.e., port 320_2) of the isolator 600, and because there is a phase shift (180°) occurring in the gyrator 300 in the second direction, the signal correspondingly would exit with a phase that is a maximum (+) exiting port 1. Therefore, there is a voltage drop across port 2 and port 1 because the signal has a phase that is a minimum (−) when entering but a maximum (+) when exiting the isolator 600, and accordingly, current flows through the lumped-element resistor 602. As such, the signal entering port 2 is attenuated before exiting port 1 in the backward direction.

In the fourth scenario for the second direction, the input signal has a phase that is a maximum (+) entering port 2 (i.e., port 320_2) of the isolator 600, and because there is a phase change (180°) occurring in the gyrator 300 in the second direction, the signal correspondingly would exit with a phase that is a minimum (−) exiting port 1. Just as in the third scenario, there is a voltage drop across port 2 and port 1 because the signal has a phase that is a maximum (+) when entering but a minimum (−) when exiting the isolator 600, and accordingly, current flows through the lumped-element resistor 602. To help illustrate this point using FIG. 11, the sinusoidal wave enters with a phase that is a peak/maximum (+) and exits at a phase that is a valley/minimum (−).

Figure 12:
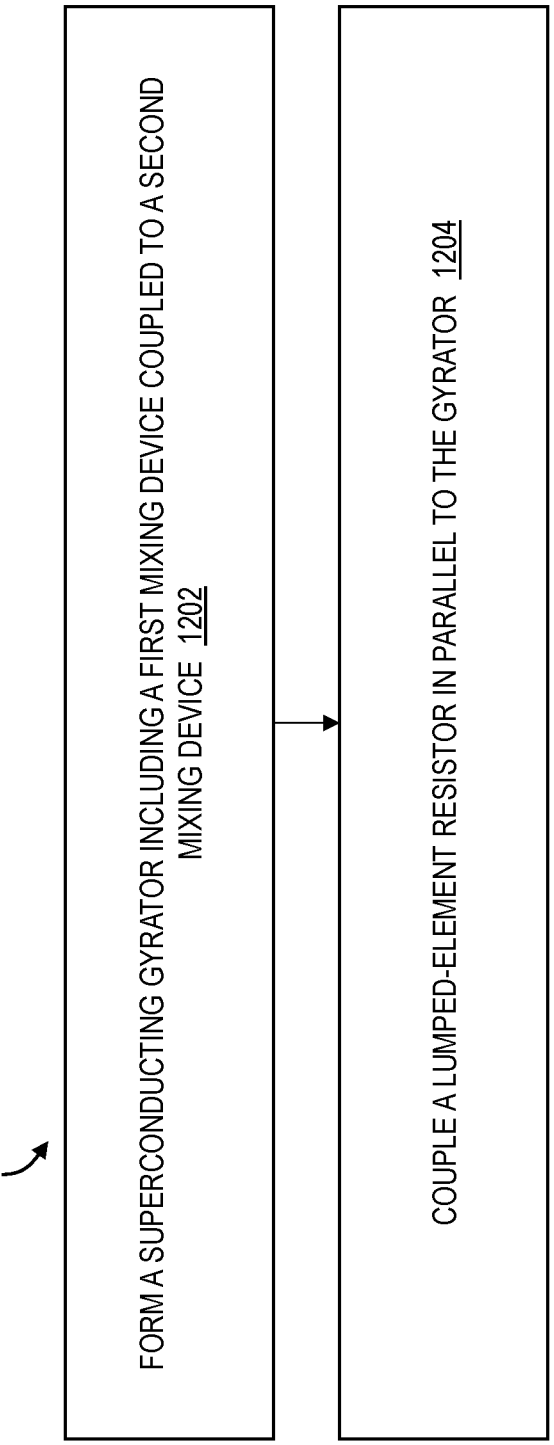
FIG. 12 depicts a flow chart of a method of forming a superconducting device according to embodiments of the present invention.

FIG. 12 depicts a flow chart 1200 of a method of forming a superconducting device 600 according to embodiments of the present invention. At block 1202, a superconducting gyrator 300 including a first mixing device 130_1 coupled to a second mixing device 130_2 is provided. At block 1204, a lumped-element resistor 602 is coupled in parallel to the gyrator 300.

The first mixing device 130_1 is coupled to the second mixing device 130_2 via a delay line 350. The delay line 350 is configured to cause a predefined phase shift. The predefined phase shift adds 90 degrees.

The first mixing device 130_1 coupled to the second mixing device 130_2 is configured to cause a non-reciprocal phase shift. The first mixing device 130_1 coupled to the second mixing device 130_2 is configured to cause a first predefined phase shift in a first direction (port 1 to port 2) and a second predefined phase shift in a second direction (port 2 to port 1). The first predefined phase shift is 0 degrees. The second predefined phase shift is 180 degrees.

The first and second mixing devices 130_1 and 130_2 are superconducting three-wave mixing devices. The gyrator 300 and the lumped-element resistor 602 form a superconducting isolator 600.

Figure 13:
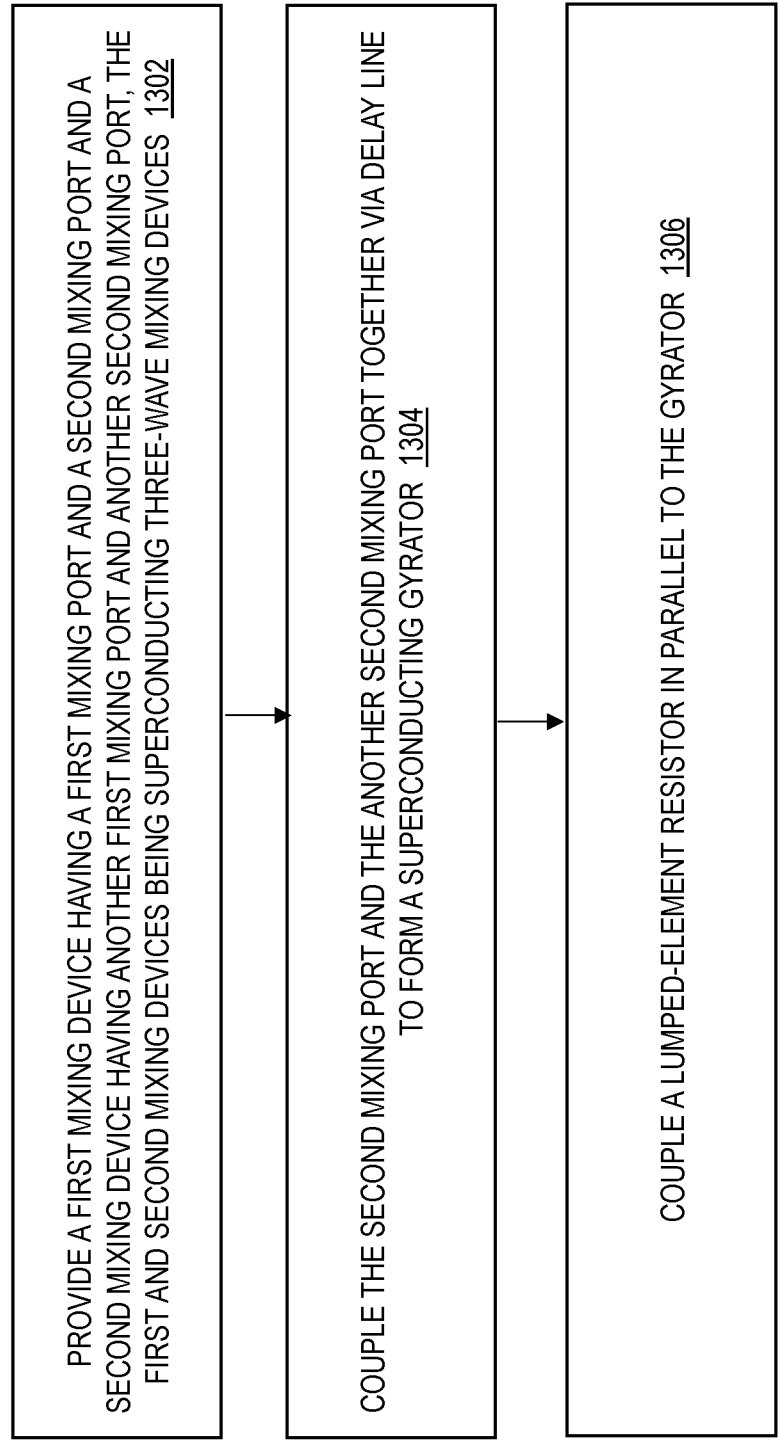
FIG. 13 depicts a flow chart of a method of forming a superconducting device according to embodiments of the present invention.

FIG. 13 depicts a flow chart 1300 of a method of fabricating a superconducting device 600 according to embodiments of the present invention. At block 1302, a first mixing device 130_1 having a first mixing port 320_1 and a second mixing port 322_1 and a second mixing device 130_2 having another first mixing port 320_2 and another second mixing port 322_2 are provided. The first and second mixing devices being superconducting three-wave mixing devices. At block 1304, the second mixing port 322_1 and the another second mixing port 322_2 are coupled together via a delay line 350 to form a gyrator 300. At block 1306, a lumped-element resistor 602 is coupled in parallel to the gyrator 300.

FIG. 14 depicts a flow chart 1400 of a method of operating a superconducting isolator 600 according to embodiments of the present invention. At block 1402, a signal is received at (port 320_1 of) a first mixing device 130_1 coupled to a second mixing device 130_2, where the first and second mixing devices 130_1, 130_2 are coupled in parallel to a lumped-element resistor 602. At block 1404, (after having received the signal from the first mixing device 130_1) the signal from the second mixing device 130_2 is output (at port 320_2), where any signal received at the second mixing device (at port 320_2) is blocked from being output from the first mixing device (at port 320_1).

The circuit elements of the circuits 130_1, 130_2, 300 can be made of superconducting material. The respective resonators and transmission/feed/pump lines are made of superconducting materials. The hybrid couplers can be made of superconducting materials. Examples of superconducting materials (at low temperatures, such as about 10-100 millikelvin (mK), or about 4 K) include niobium, aluminum, tantalum, etc. For example, the Josephson junctions are made of superconducting material, and their tunnel junctions can be made of a thin tunnel barrier, such as an oxide. The capacitors can be made of superconducting material separated by low-loss dielectric material. The transmission lines (i.e., wires) connecting the various elements are made of a superconducting material.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to superconducting device and integrated circuit (IC) fabrication may or may not be described in detail herein. By way of background, however, a more general description of the superconducting device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a superconducting over a dielectric (e.g., silicon) substrate, some of which are described in the immediately following paragraphs.

In general, the various processes used to form a microchip that will be packaged into an IC fall into general categories, including, film deposition, removal/etching, and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Films of both conductors (e.g., poly-silicon, aluminum, copper, etc.) and insulators (e.g., various forms of silicon dioxide, silicon nitride, etc.) are used to connect and isolate components. Lithography is the formation of three-dimensional relief images or patterns on the semiconductor substrate for subsequent transfer of the pattern to the substrate. In lithography, the patterns are formed by a light sensitive polymer called a photo-resist. To build the complex structures of a circuit, lithography and etch pattern transfer steps are repeated multiple times. Each pattern being printed on the wafer is aligned to the previously formed patterns and slowly the conductors, insulators and other regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A superconducting device comprising:
    a gyrator including a first mixing device coupled to a second mixing device; and
    a lumped-element resistor connected in parallel to the gyrator.

2. The superconducting device of claim 1, wherein the first mixing device is coupled to the second mixing device via a delay line.

3. The superconducting device of claim 2, wherein the delay line is configured to cause a predefined phase shift.

4. The superconducting device of claim 3, wherein the predefined phase shift adds 90 degrees.

5. The superconducting device of claim 1, wherein the first mixing device coupled to the second mixing device is configured to cause a non-reciprocal phase shift.

6. The superconducting device of claim 1, wherein the first mixing device coupled to the second mixing device is configured to cause a first predefined phase shift in a first direction and a second predefined phase shift in a second direction.

7. The superconducting device of claim 6, wherein the first predefined phase shift is 0 degrees.

8. The superconducting device of claim 6, wherein the second predefined phase shift is 180 degrees.

9. The superconducting device of claim 1, wherein the first and second mixing devices are superconducting three-wave mixing devices.

10. The superconducting device of claim 1, wherein the gyrator and the lumped-element resistor form a superconducting isolator.

11. A superconducting device comprising:
- a first mixing device having a first mixing port and a second mixing port;
- a second mixing device having another first mixing port and another second mixing port, the first and second mixing devices being superconducting three-wave mixing devices, wherein the second mixing port and the another second mixing port are coupled together via a delay line to form a gyrator; and
- a lumped-element resistor coupled in parallel to the gyrator.

12. The superconducting device of claim 11, wherein the first mixing device is configured to perform a first frequency conversion and the second mixing device is configured to perform a second frequency conversion such that a combination of the first and second frequency conversions negate one another, thereby transmitting a signal without a frequency change.

13. The superconducting device of claim 11, wherein the first mixing port and the another first mixing port are signal ports, and the second mixing port and the another second mixing port are idler ports.

* * * * *